US012804914B2

(12) United States Patent
Chang et al.

(10) Patent No.: US 12,804,914 B2
(45) Date of Patent: Nov. 17, 2026

(54) SEMICONDUCTOR DEVICES INCLUDING CIRCUITS UNDER INDUCTOR (CUL)

(71) Applicant: Taiwan Semiconductor Manufacturing Company, Ltd., Hsinchu (TW)

(72) Inventors: Kai-Chun Chang, Hsinchu (TW); Hsieh-Hung Hsieh, Hsinchu (TW); Tzu-Jin Yeh, Hsinchu (TW); Jun-De Jin, Hsinchu (TW); Ching-Chung Hsu, Hsinchu (TW); Chung-Long Chang, Hsinchu (TW); Hua-Chou Tseng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 352 days.

(21) Appl. No.: 18/513,873

(22) Filed: Nov. 20, 2023

(65) Prior Publication Data

US 2025/0169085 A1 May 22, 2025

(51) Int. Cl.

| | |
|---|---|
| ***H10D 1/20*** | (2025.01) |
| ***H01F 17/00*** | (2006.01) |
| ***H01F 27/28*** | (2006.01) |
| ***H01F 27/29*** | (2006.01) |
| ***H10W 42/20*** | (2026.01) |
| ***H10W 44/20*** | (2026.01) |
| ***H10W 70/685*** | (2026.01) |

(52) U.S. Cl.

CPC ........... *H10D 1/20* (2025.01); *H01F 27/2804* (2013.01); *H01F 27/29* (2013.01); *H10W 42/20* (2026.01); *H10W 44/20* (2026.01); *H10W 70/685* (2026.01); *H01F 2017/002* (2013.01); *H01F 2017/0073* (2013.01); *H10W 44/209* (2026.01); *H10W 44/241* (2026.01)

(58) Field of Classification Search

CPC ........... H01F 17/0006; H01F 2017/002; H01F 2017/0046; H01F 2017/0073; H01F 2017/008; H01F 2017/0086; H01F 27/2804; H01F 27/29; H10D 1/20; H10W 42/20; H10W 44/20; H10W 44/209; H10W 44/241; H10W 44/501; H10W 70/685

See application file for complete search history.

(56) References Cited

U.S. PATENT DOCUMENTS

| | | | |
|---|---|---|---|
| 2002/0047757 | A1 | 4/2002 | Manku et al. |
| 2005/0231304 | A1 | 10/2005 | White et al. |

(Continued)

FOREIGN PATENT DOCUMENTS

| | | |
|---|---|---|
| TW | 201926624 | 7/2019 |

OTHER PUBLICATIONS

TW Office Action on Patent Application No. 113101784 dated Nov. 20, 2024.

*Primary Examiner* — Shaun M Campbell
(74) *Attorney, Agent, or Firm* — Foley & Lardner LLP

(57) ABSTRACT

Semiconductor device isolation is provided. In one aspect, a semiconductor device include a spiral inductor. The semiconductor device includes a patterned ground shield (PGS) electrically coupled with the spiral inductor. The semiconductor device includes a filter configured to exchange energy with the PGS. The semiconductor device includes a circuit vertically spaced from the inductor, the PGS disposed between the circuit and the spiral inductor.

20 Claims, 7 Drawing Sheets

(56) References Cited

U.S. PATENT DOCUMENTS

| | | | | |
|---|---|---|---|---|
| 2012/0242446 | A1* | 9/2012 | Wu | H01F 17/0006<br>336/192 |
| 2017/0148750 | A1 | 5/2017 | Saraswat et al. | |
| 2019/0164886 | A1* | 5/2019 | Chen | H10D 1/20 |
| 2019/0393148 | A1* | 12/2019 | Uchida | H10D 1/20 |
| 2021/0296258 | A1* | 9/2021 | Chien | H10W 20/497 |
| 2022/0173058 | A1* | 6/2022 | Smith, Jr. | H03H 7/06 |
| 2022/0415555 | A1 | 12/2022 | Dogiamis et al. | |
| 2023/0069734 | A1* | 3/2023 | Lai | H10D 1/20 |

* cited by examiner

SEMICONDUCTOR DEVICES INCLUDING CIRCUITS UNDER INDUCTOR (CUL)

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, as device densification continues, various features of the semiconductor device may interact. For example, high frequency signals can couple between various components of a semiconductor device, which may interfere with an operation of one or more circuits. Thus some areas of semiconductor devices may include keep outs, operational restrictions, or other device portions which are not employed for active circuits or interconnections therebetween. Improvements to the art are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
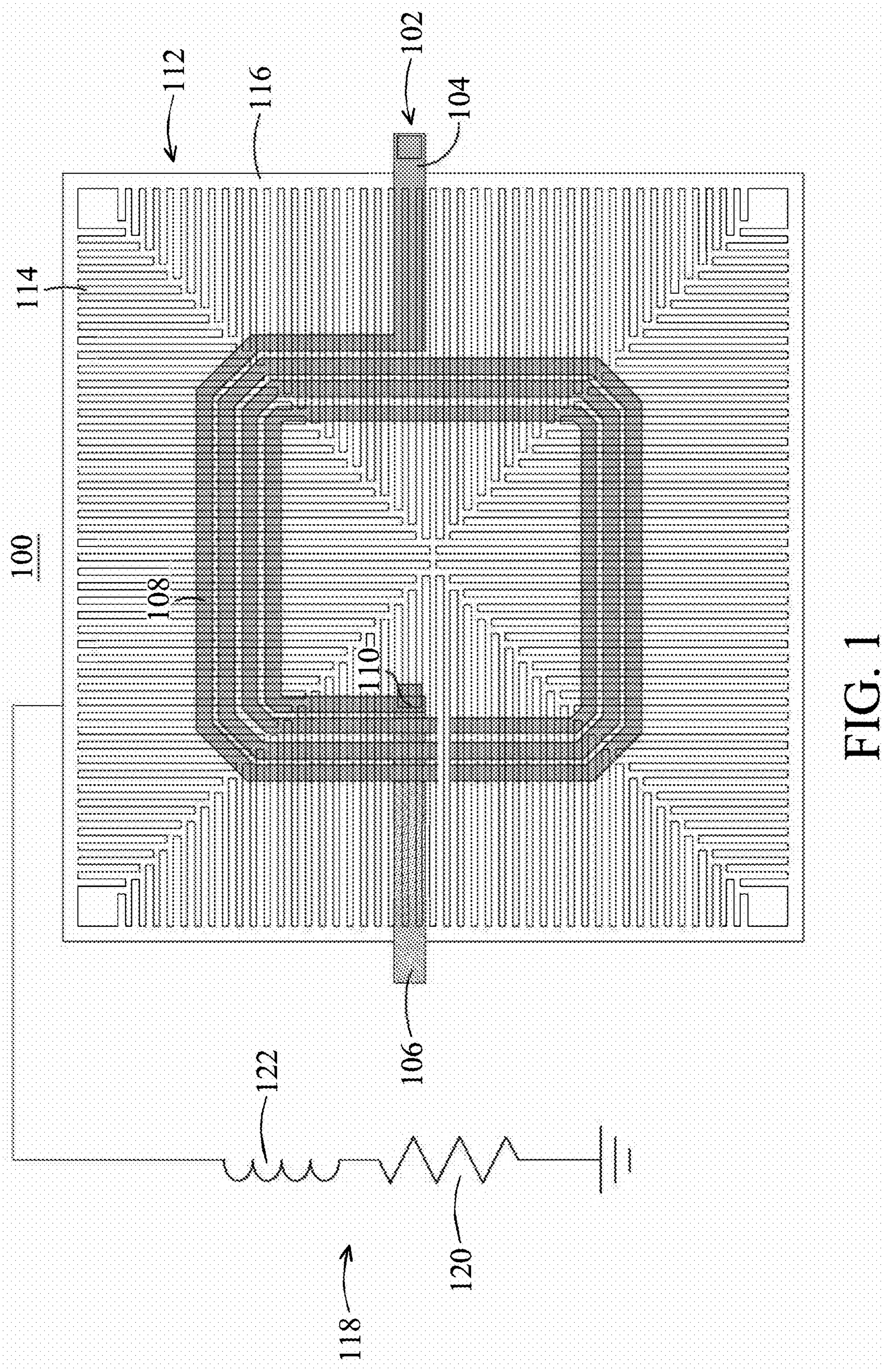
FIG. 1 is a hybrid stack-up view of a semiconductor device, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

References to "or" may be construed as inclusive so that any terms described using "or" may indicate any of a single, more than one, and all of the described terms. References to at least one of a conjunctive list of terms may be construed as an inclusive OR to indicate any of a single, more than one, and all of the described terms. For example, a reference to "at least one of 'A' and 'B'" can include only 'A', only 'B', as well as both 'A' and 'B'. Such references used in conjunction with "comprising" or other open terminology can include additional items.

Generally, patterned grounds shields (PGS) can shield various circuit components from electromagnetically active components, such as spiral inductors. Operation of a PGS can vary according to a construction thereof. For example, providing additional vias or otherwise improving ground paths can improve an isolation achieved between the spiral inductor and other circuit elements. In some instances, the isolation achieved with the PGS may be less than an isolation threshold at a relevant frequency or range thereof. For example, the PGS may not connect to a filter configured to attenuate energy corresponding to the relevant frequency. A filter can be coupled to the PGS to improve operation (e.g., increase isolation) with regard to such a frequency or frequency range. For example, the filter can include a series resistor-inductor (RL) filter. The combination of the RL filter with various transmission line effects or parasitic capacitances of the PGS can generate an inductive-capacitive (LC) cavity, which may reduce coupling effects with other elements of a semiconductor device. That is, the LC cavity can alternatively store and release energy between the inductor, and various elements contributing a capacitance thereto, which may reduce energy coupled into other circuits. A selection of filter components can vary according to a center frequency (e.g., resonant center) of the LC cavity. Such a selection or geometry of filter elements can improve isolation at one or more desired frequencies.

FIG. 1 is a hybrid stack-up view of a semiconductor device 100, according to some embodiments. The hybrid stack-up view includes a depiction of a layout of various conductive elements forming a spiral inductor 102 and a shielding element therefor, along with a schematic view of a filter 118 connected to the shielding element. The spiral inductor 102 can refer to an assembly formed from a conductive element disposed on one or more levels of a semiconductor device 100. Particularly, the spiral inductor 102 includes a first terminal 104 extending to a coil 108, which, in turn, extends to a second terminal 106. As indicated, a portion of at least one of the terminals 104, 106 can include a vertical extension (depicted as into the page) such that the terminal 106 can pass over or under a portion of the coil 108, to connect to a signal, such as a power signal (e.g., can include a via structure 110). The spiral of the spiral inductor 102 can include various shapes, such as concentric circles, octagons or other regular polygons. For example, the depicted square-spiral inductor 102 includes a generally square coil 108, having chamfered corners, which may improve a quality factor of the inductor, or aid in manufacturability (e.g., reduce over-etching and accumulation of stress at sharp corners). Various further instances of spiral coils 108 can be employed, such as multi-level spiral coils 108, multi-tap spiral coil 108, and so forth.

A shielding element for the spiral inductor 102 includes a patterned ground shield 112 (sometimes referred to as a magnetic shield). Various patterned ground shield (PGS) 112 designs can be employed according to various embodiments of the present disclosure. The depicted design includes various conductive elements 114 disposed perpendicular to a direction of current flow through the coil 108. Such positioning can capture magnetic flux from the coil 108, which may mitigate coupling between the coil 108 and further devices, such as circuit components located near to the coil 108. Such coupling can induce currents in the PGS 112, which may, in turn, couple to other elements, such as the circuit components. Thus, the PGS 112 can include conductive interconnects 116 between the conductive elements 114 to control a location of return currents circulating about the PGS 112. Further, various connections to a reference voltage (which can include a ground reference, or a reference of another voltage, such as VCC) can aid reducing the currents in the PGS, and thus aid isolation. Although the reduction of impedance between the PGS 112 and a ground plane can aid in isolation, adequate grounding to achieve an isolation threshold may not be practical in some instances. Further, the inclusion of ground planes may increase capacitance to the coil 108.

Inclusion of a filter 118 (e.g., a notch filter 118) can store energy according to a resonant circuit. For example, the filter 118 can form an LC cavity storing energy at a resonant frequency of the system, between an inductor 122 (or an aggregate inductance) and an aggregate capacitance (based on the geometry of the PGS 112 and a dielectric disposed between the various portions, to form a capacitor) which may thereafter be dissipated according to a resistance 120 of the filter 118, or another ground path. Thus, the energy density at the resonant frequency can reduce, such that coupling at between the coil 108 or PGS 112 and various circuit components is mitigated. That is, the isolation between the coil 108 and various circuit components in proximity thereto can be increased.

Figure 2:
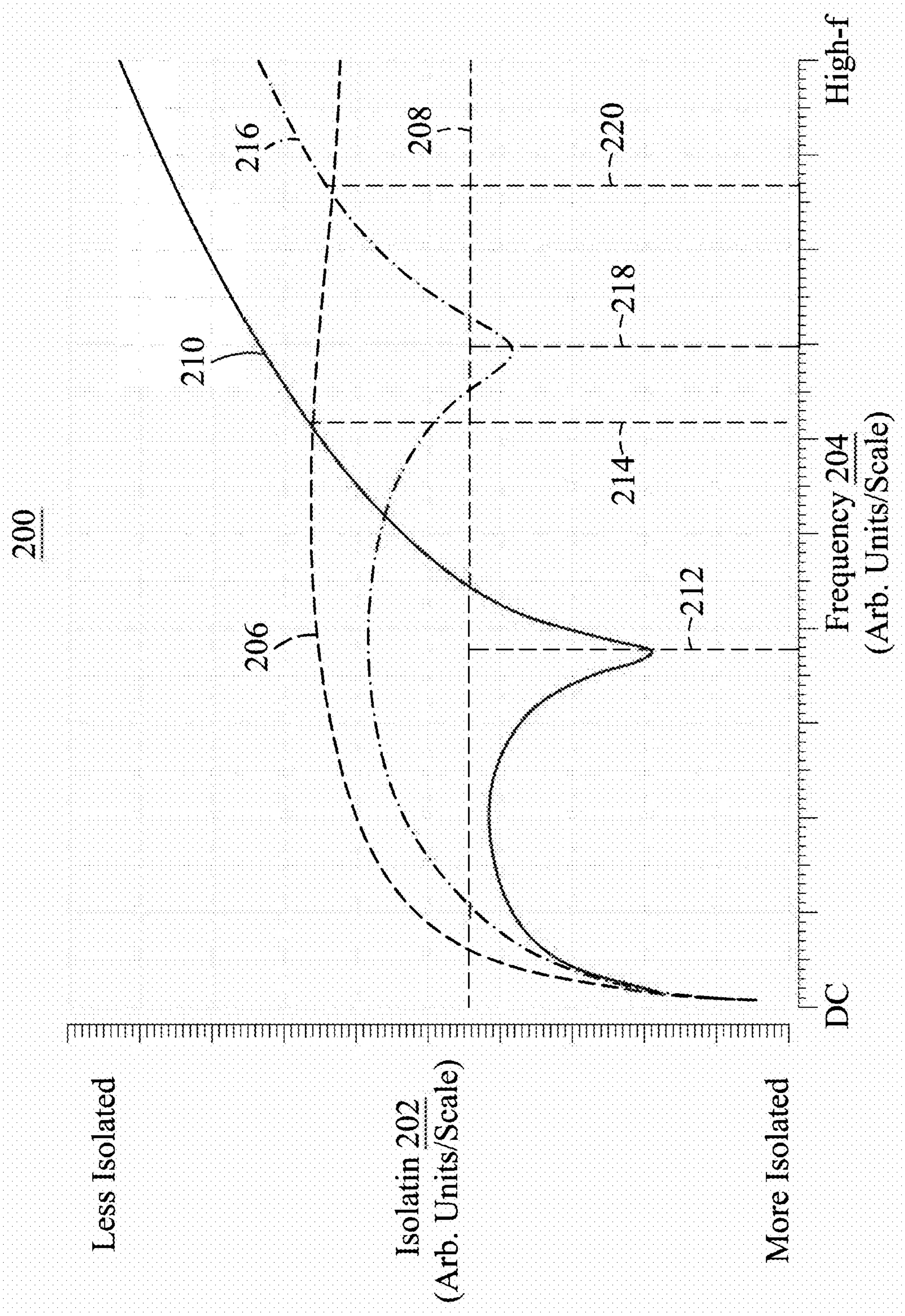
FIG. 2 is a graphical depiction indicative of an isolation associated with an application of a filter to a patterned ground shield (PGS), according to some embodiments.

FIG. 2 is a graphical depiction 200 indicative of an isolation associated with an application of filters 118 to a PGS 112, according to some embodiments. The isolation is depicted along a isolation axis 202, such as a decibel scale extending from more isolation at a lowermost portion of the isolation axis 202, and less isolation at an uppermost portion of the isolation axis 202. The isolation can refer to an isolation between the coil 108 or the PGS 112 and any component of a circuit such as an active component (e.g., diode, transistor, or passive element) or interconnect. A frequency axes 204 extends from low frequency (e.g., DC state) to high frequencies. High frequencies can vary according to a particular application. For example, according to various embodiments of the present disclosure, a high-frequency can refer to a frequency range in the gigahertz (GHz) range, such as in the tens of GHz, or otherwise in an RF band extending to approximately 300 GHz.

A first frequency-dependent isolation line 206 extends from high isolation (according to an arbitrary scale) at a DC state (e.g., corresponding to DC electrical isolation between the coil 108 or the PGS 112 and the circuit). As the frequency increases (e.g., into the GHz range) the isolation decreases, such as according to induced currents in the PGS 112 which couple to circuit elements. The particular curve of the first frequency-dependent isolation line 206 will vary according to drive strength, circuit, PGS 112 or coil 108 geometry, biasing voltages, and so forth. However, the first frequency-dependent isolation line 206 remains above an isolation threshold line 208, once rising above the line at a relatively low frequency (which may correspond to a frequency in the MHz range, or a low GHz range, according to some embodiments, though various coil 108, PGS 112, or circuit geometries can result in various other frequency ranges). Thus, the isolation can be less than a threshold, where the threshold may correspond to a design rule, calculated value, or other desired value.

A second frequency-dependent isolation line 210 depicts an isolation between the coil 108 and the circuit, where a filter 118 is connected to the PGS 112. A first center frequency 212 of the second frequency-dependent isolation line 210 can correspond to a resonant frequency of the LC cavity. That is, as indicated above, energy maintained within or dissipated by a PGS-filter complex can be unavailable to couple with circuit elements, increasing isolation. The second frequency-dependent isolation line 210 exhibits better isolation from a DC state to a first crossover point 214, where the parasitic capacitances and inductance 122 introduced by the filter 118 overcome energy mitigated by the filter 118.

Both of the first center frequency 212 and the first crossover point 214 can vary according to filter attributes, such as a routing, location, material, or other attribute of the filter 118 associated with any parasitic or leakage paths, as well as a value of the components of the filter 118 depicted in FIG. 1 (e.g. changes to inductance 122 or resistance 120). For example, a second frequency-dependent isolation line 216 is depicted having second center frequency 218 at a higher frequency than the first center frequency 212, and a second crossover point 220 at a higher frequency than the first crossover point 214. Although the depicted first and second frequency-dependent isolation lines 210, 216 depict indications of isolation corresponding to alternative filters 118, in some embodiment, a multi-polar filter (e.g., a filter including a first and second RL branch) can be connected to the PGS 112. For example, the filters can operate at different frequencies of spiral inductor 102 operation, such as harmonics of a base frequency.

A simplified depiction of a center frequency may correspond with a cutoff frequency associated with the filter 118. For example, for the series RL filter 118 depicted in FIG. 1, a corner frequency is defined according to:

$$f_c = \frac{R}{2\pi L}$$

where either of R or L can correspond to a component, or a lump model. For example, the resistance 120 can include various portions of the semiconductor device 100 (e.g., the resistance 120 can include a resistor implemented as a serpentine resistor, along with a series resistance 120 of the inductor 122, along with any interconnections, etc.

Although such a relationship can provide a first order approximation (e.g., may provide an order of magnitude of the center frequency), further simulation or analysis may be employed to determine the actual center frequency, such as a frequency of about one Ghz. For example, a first series RL filter 118 can include a one nanohenry (nH) inductor 122 and a twenty ohm resistor 120, indicating a corner frequency of about three GHz, but a corresponding center frequency of a notch filter 118 can be about seven and one half GHz. In another example, a first series RL filter 118 can include a one-hundred pH inductor 122 and a ten ohm resistor 120, indicating a corner frequency of about sixteen GHz, but a corresponding center frequency of a notch filter 118 can be about fourteen GHz. The selection of components for a filter 118 based on a frequency of interest can be referred to as tuning of the filter 118. The frequency of interest can include the center frequency or another frequency, or range of frequencies which do not exceed a cross over point.

Figure 3:
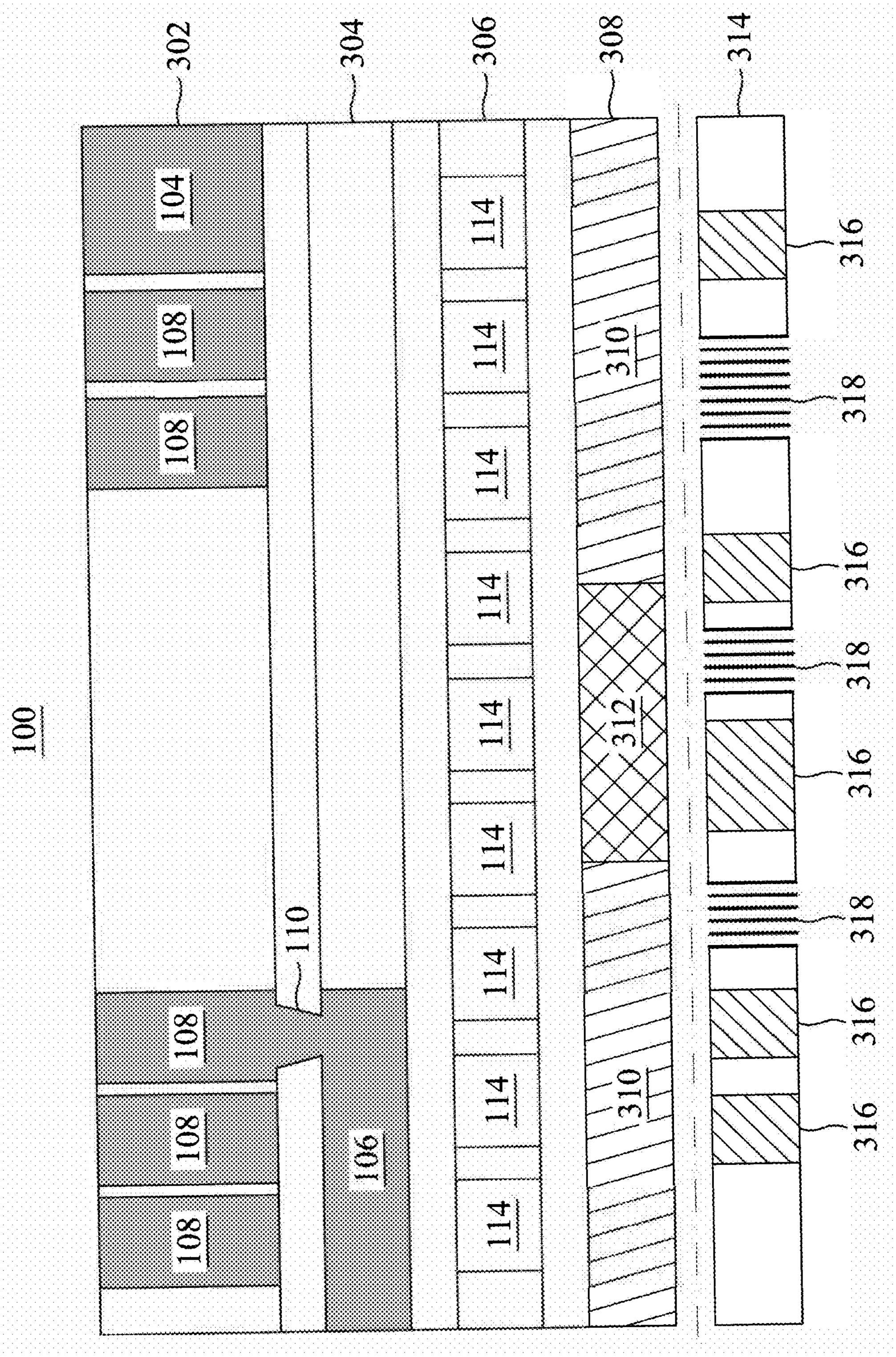
FIG. 3 is a cross sectional view depicting a semiconductor device, according to some embodiments.

FIG. 3 is a cross sectional view depicting a semiconductor device 100, according to some embodiments. The cross sectional view depicts and uppermost layer as a redistribution (RDL 302) layer. The inclusion of an RDL 302 which is thicker (as depicted, vertically larger) than other layers can form a spiral inductor 102 which has a relatively low series resistance, though such a depiction is not intended to be limiting. The RDL can be include from copper, aluminum, or other conductive materials. Further, in various embodiments, further layers may be disposed over the RDL 302, though such layers are not depicted for clarity and brevity. The RDL 302 includes various, generally concentric portions of the coil 108, along with a depicted first terminal 104 connected to the coil 108, shown extending away from the coil 108. That is, the depicted cross sectional view can be along a cut line extending through a center of the coil 108 depicted in FIG. 1, the cut line passing through the first terminal 104 and second terminal 106.

Further to the second terminal 106, the coil 108 is shown coupled to a via structure 110 to vertically extend from the RDL 302 to another layer of the semiconductor device 100, such as a third metallization layer 304. The second terminal 106 is depicted passing under the coil 108 in the third metallization layer 304, such as to connect to another element of the semiconductor device 100. Although no other conductive elements are depicted on the third metallization layer 304, in various embodiments, the layer can include additional conductive elements. For example, the area can include a dummy fill to meet design rules, or, as is further described with regard to FIG. 5, filter components, such as taps, terminals, or coils 108 of an inductor 122, resistive elements (e.g., serpentine, bar, or grid resistors), or so forth. Such elements can couple to further via structures (not depicted), to couple to the PGS 112.

A second metallization layer 306 of the semiconductor device 100 includes the depicted conductive elements 114 of the PGS 112. Such conductive elements 114 are shown extending parallel to a current flow through the coil 108 (e.g., shown parallel to the conductive elements of the coil 108), to depict another non-limiting example of the various geometries various portions of a PGS 112 can include. The second metallization layer 306 may be referred to as "vertically adjacent" to the third metallization layer 304 and a first metallization layer 308, even where a spacing for a via structure 110, or a via structure 110 itself, is present.

The first metallization layer 308 of the semiconductor device 100 is shown divided into a central area, indicating a restricted placement area 312, such as an area where a frequency, sensitivity, or other characteristic of circuit elements is limited. For example, a propagation of clocks, non-slewed probes, or other signals may not pass through the restricted placement area 312, such as to avoid coupling to the coil 108, to interfere with the operation thereof, or to avoid the coil 108 interfering with the circuit elements (e.g., to avoid coupling a signal from the coil 108 into clock or data lines, which may thereafter interfere with such signals). Bounding the restricted placement area 312 is a keep out area 310 which can impose additional restrictions. For example, the area directly under the coil 108 elements can correspond to the keep out area 310, and a center region of the coil 108 can correspond to the restricted placement area 312. A top view is provided hereinafter, with regard to FIG. 4. The description of the keep out area 310 and restricted placement area 312 is not intended to be limiting, according to various thresholds, one or more categories of placement restriction can be applied to the placement of circuits under inductors (CUL).

Various further layers (e.g., metallization layers) can underlay the depicted first metallization layer 308. For example, the first metallization layer 308 can be formed over a semiconductor substrate, with, for example, zero, one, two, or three metallization layers therebetween. The semiconductor substrate can include an active surface 314 including various n-wells 316 and p-wells 318 (along with other devices, according to a planar or other process) which can be interconnected to form diodes, transistors, image sensors, and the like, which may, in turn, be interconnected, or connected to other terminals or devices to form circuits such as logic circuits, memory devices, and so forth. Such interconnections can be formed in any of the metallization layers. Either of the regions disposed along the active surface 314 or the interconnection therebetween, or between other devices or terminals, may be referred to as circuits. Thus, the isolation between the coil 108 and a circuit can depend upon various circuit portions.

Figure 4:
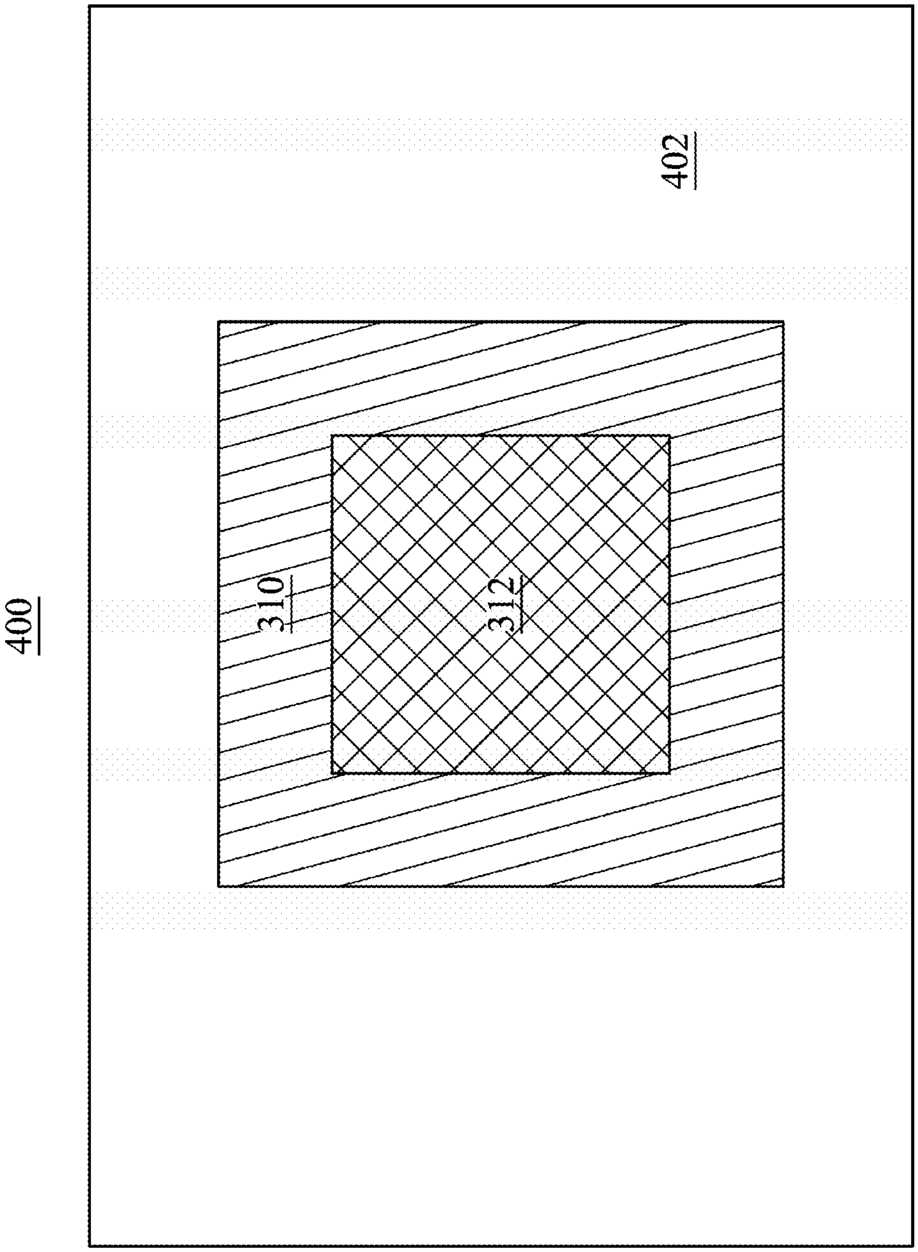
FIG. 4 is a is a keep out diagram showing keep out areas associated with a spiral inductor with a filter, such as the spiral inductor of FIG. 1.

FIG. 4 is a is a keep out diagram 400 showing keep out areas associated with a spiral inductor 102 with a filter 118, such as the spiral inductor 102 of FIG. 1. The keep out diagram 400 can correspond to various lateral planes of a semiconductor device 100, such as an active surface 314 of a semiconductor substrate including p-wells and n-wells, vertically spaced from the coil 108 of the spiral inductor 102, or metallization layers 304, 306, 308 including conductive elements, such as conductive elements to interconnect the active surface 314 to form various circuits. In some embodiments, various layers can have one or more corresponding keep out diagrams.

The filter 118 corresponding to the depicted keep out diagram 400 can include an RL filter 118 which is not tuned to a frequency of operation, such that an isolation between the coil 108 and circuit exceeds a threshold. A restricted placement area 312 can correspond to the center region of the coil 108 (e.g., the central opening defined by the winding). For example, the central opening can be defined according to a lateral offset from an innermost portion of the coil 108. A keep out area 310 can correspond to an area directly below the windings of the coils 108, or offset the lateral offset therefrom. Other portions of the semiconductor device 100 can include unrestricted placement areas 402 (at least with respect to the spiral coil 102). A different keep out diagram 400 can correspond to various layers of a semiconductor device 100. For example, layers of the semiconductor device 100 disposed further from the PGS 112 or the coil 108 can omit entirely or include lesser restricted placement areas 312 or keep out areas 310, or less restrictive restricted placement areas 312 or keep out areas 310.

Figure 5:
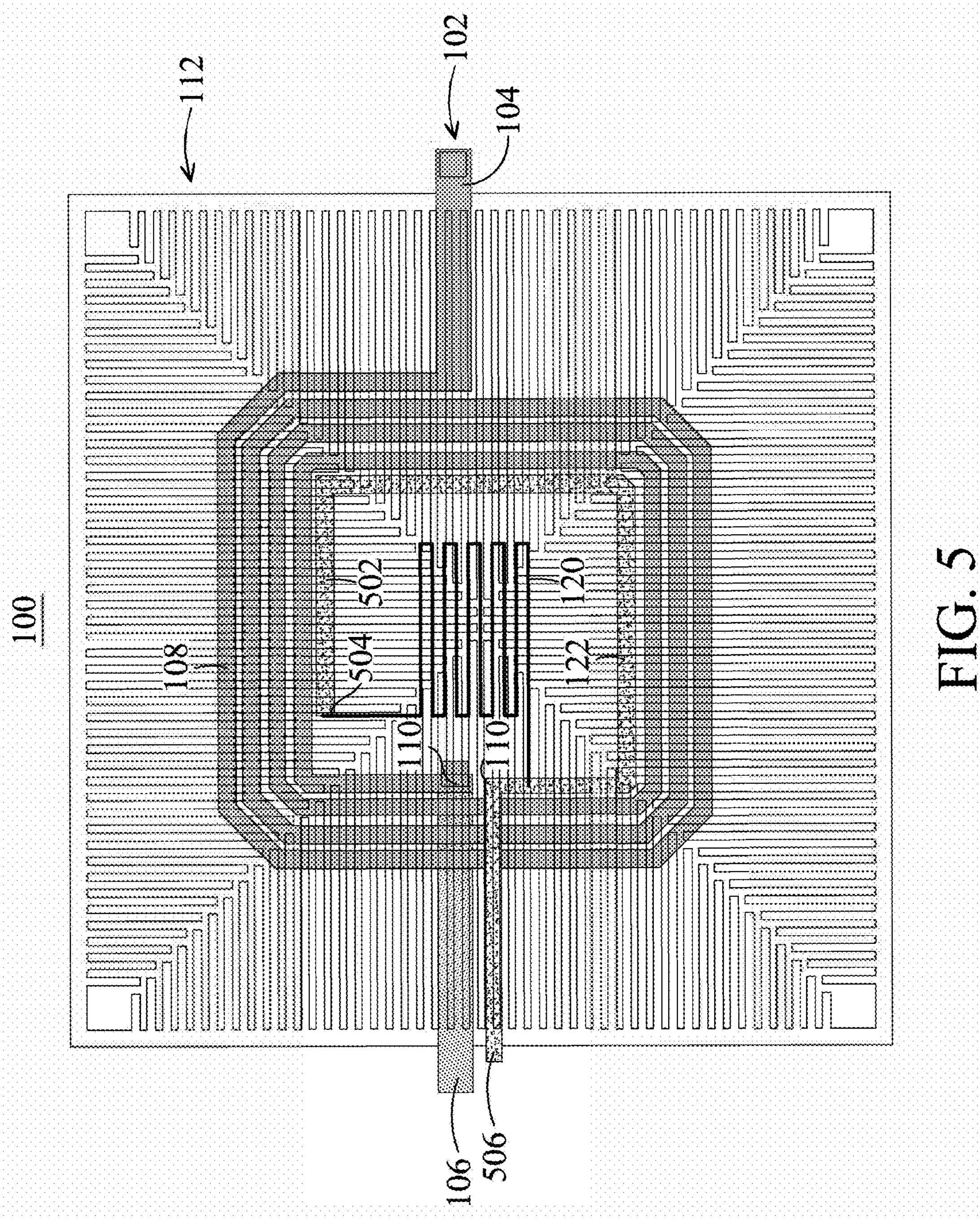
FIG. 5 is a top layout view of a semiconductor device including a multi-tap coil, according to some embodiments.

FIG. 5 is a top layout view of a semiconductor device 100 including a multi-tap coil 108, according to some embodiments. The depicted semiconductor device 100 implements at least a portion of the filter 118 along a same vertical plane of the coil 108 (including the center region thereof). A multi-tap inductor may refer to or include an inductor including a first terminal, a second terminal, and at least one terminal between to the first and second terminals. The multi-tap inductor can include a pattern for multiple inductors. For example, two intermediate terminals can, for at least some signals (e.g., DC signals), electrically isolate two inductors from each other. Multi-tap inductor patterns be relatively space-efficient, or dense, even for inductors which are not functionally related. Moreover, a proximity of the windings in multi-tap inductors may aid in mutual coupling therebetween, according to some embodiments.

Particularly, the coil 108 can include additional windings 502 laterally bounded by, as depicted, or bounding, the other windings of the coil 108. The additional windings 502 can be disposed along a same layer of the semiconductor device 100 as the other coil 108 portions (e.g., the RDL 302), or can be disposed on another layer (e.g., the third metallization layer 304). The additional windings 502 can terminate at a first terminal 504, shown terminating within a center region of the coil 108. That is, the additional windings 502 can terminate at a via structure connecting to a further layer, or another conductive element disposed on a same layer (e.g., the resistor 120, or a portion thereof). Another end of the additional windings 502 can extend to another via structure 110, such that a second terminal 506 for the additional windings 502 extend to a lateral exterior of the coil 108. For example, the second terminal 506 of the additional windings 502 can extend along a same layer as the second terminal 106 of the coil 108, or along another layer (e.g., over a layer disposed over the RDL 302, according to the view depicted in FIG. 3). Although one terminal 504 is depicted as terminating within a center region of the coil 108, and another 506 exterior to the coil 108, various embodiment can connect circuit portions in various positions. For example, both terminals 504, 506 can originate and terminate within or outside of the center region of the coil 108, or both terminals 504, 506 can pass over or under the other windings of the coil 108.

Further depicted is a resistor 120 for the filter 118, which, although depicted as a serpentine resistor, can include various elements, within or between the layers of the semiconductor device 100. In some embodiments, the resistor can include inter-layer connections. For example, the resistor 120 can include a via structure 100 to couple to another element, or via chains. Further, although depicted separately, the inductor 122 and resistance 120 of the filter 118 can include coextensive elements. For example, rather than forming the resistor as a serpentine, at least some portions can form lateral or multi-layer spirals configured to increase a series resistance 120. That is, as opposed to employing the "thick" RDL 302, an inductor 122 can be formed in relatively "thin" metallization layers, so as to increase resistance 120. Likewise, the terminals of the resistor can originate, terminate, or pass over or under the coil 108 windings, according to various placements. For example, where the inductor 122 and resistor 120 are implemented according to an integrated passive device (IPD), they can connect to an outer portion of the PGS 112 exterior to the coil 108.

Various combinations of elements can achieve (e.g., tune) various filters 118 according to an isolation threshold at a frequency of interest. Further, such an illustrative example is not intended to be limiting; in various embodiments, either of the resistor 120 or inductor 122 can be formed in another portion of the semiconductor device 100, such as along the active surface 314, from epitaxial silicon along another layer, or can include discrete devices connected thereto (e.g., IPDs). Further, some filters 118 can include additional elements, such as capacitors or parallel resistors 120 or inductors 122, which may adjust or augment a center frequency (e.g., form a filter 118 with multiple notches, corresponding to one or more frequencies of interest).

Figure 6:
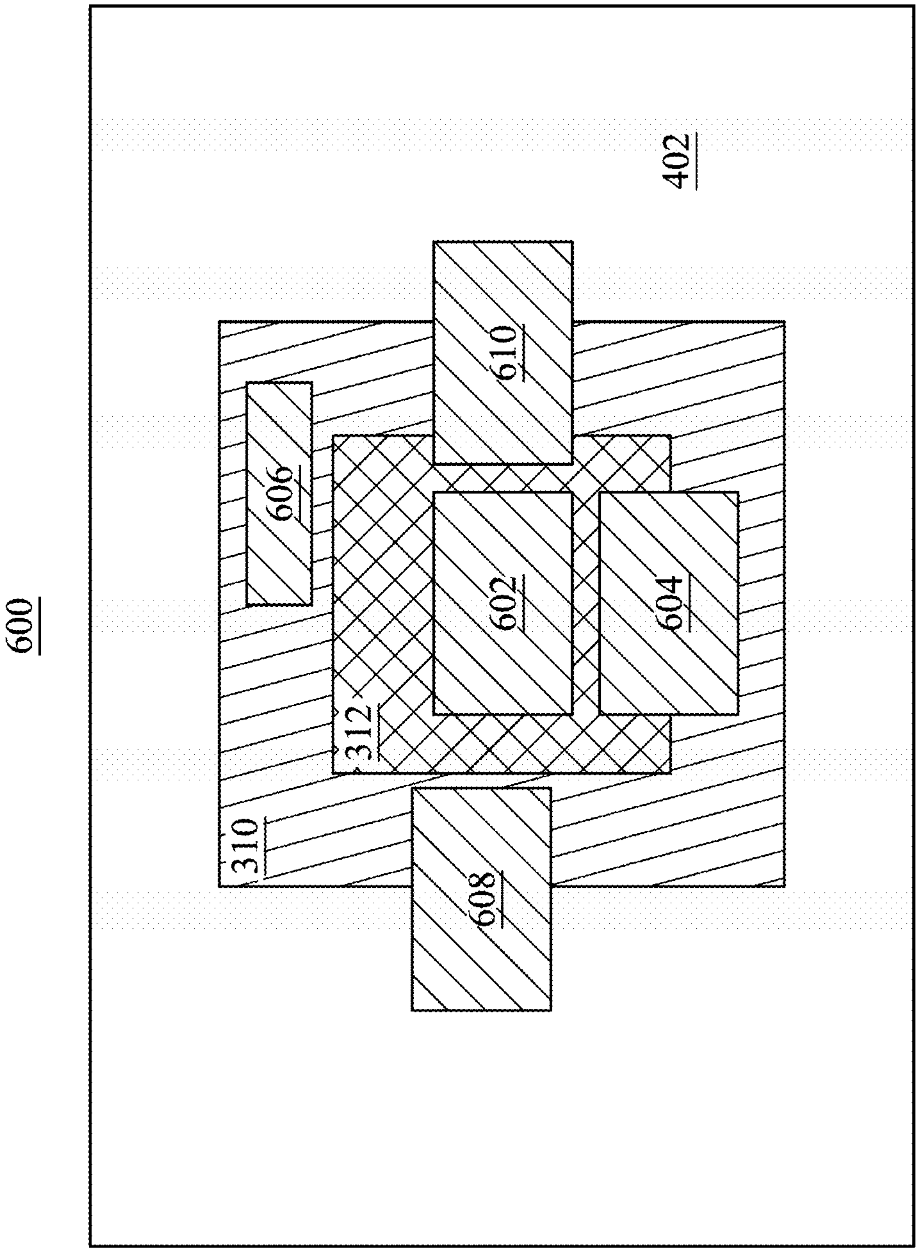
FIG. 6 is a top view of a semiconductor device including various circuits, according to some embodiments.

Referring now to FIG. 6, a top view 600 of a semiconductor device 100 including various circuits is provided according to some embodiments. For example, the top view 600 can correspond to the keep out diagram 400 of FIG. 4, wherein the filter 118 is tuned to a frequency of interest. For example, the spiral inductor 102 can be a part of a power distribution network (PDN) operating at a predefined frequency, wherein the notch filter is configured with a center frequency corresponding to the operating frequency of the spiral inductor 102.

A first circuit 602, or portion thereof, is shown disposed under a center region of the view, which may be vertically spaced from an area laterally bounded by the coil 108 windings (e.g., corresponding to the restricted placement area 312 of FIG. 4). A second circuit 604, or portion thereof, is shown disposed under a center region of the view and vertically spaced from the coil 108 windings (e.g., corresponding to the keep out area 310 and the restricted placement area 312 of FIG. 4). A third circuit 606, or portion thereof, is shown vertically spaced from the coil 108 windings (e.g., corresponding to the keep out area 310 of FIG. 4). A fourth circuit 608, or portion thereof, is shown disposed vertically spaced from the coil 108 windings and exterior thereto (e.g., corresponding to the restricted placement area 312 and the unrestricted placement areas 402 of FIG. 4). A fifth circuit 610, or portion thereof, is shown under a center region of the view, disposed vertically spaced from the coil 108 windings, and exterior to the windings (e.g., corresponding to the keep out area 310, the restricted placement area 312, and the unrestricted placement areas 402 of FIG. 4).

Figure 7:
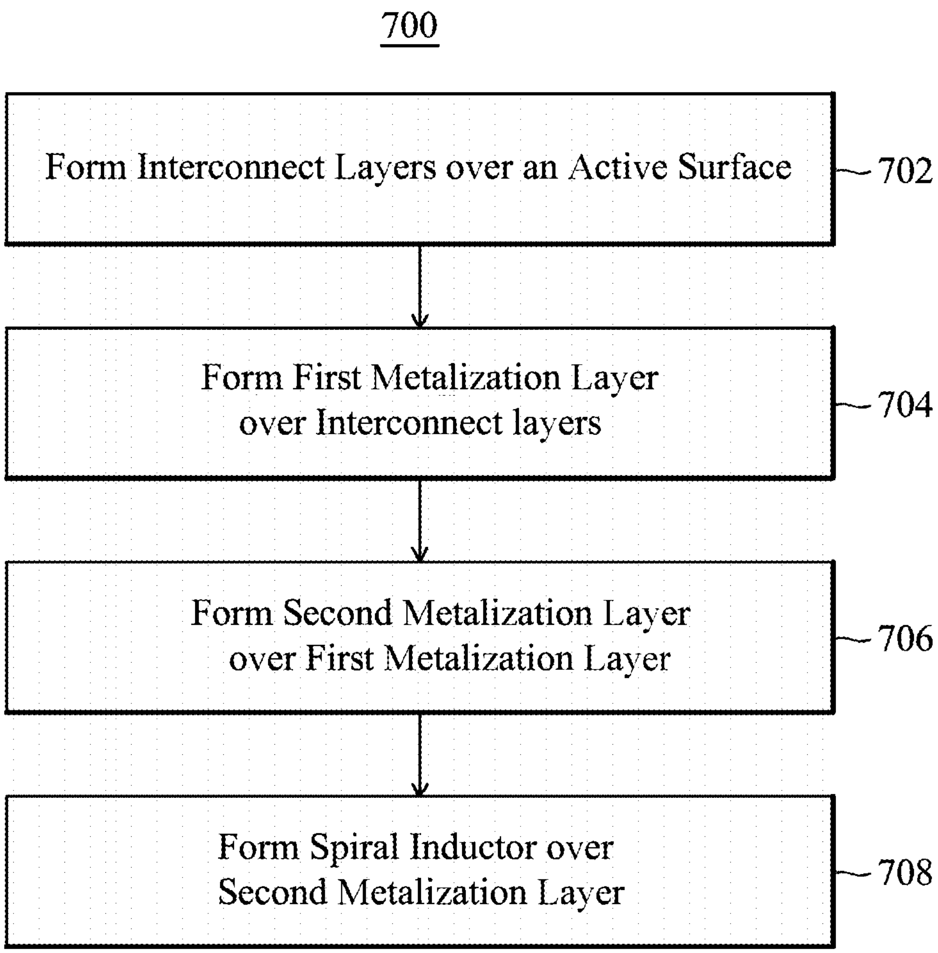
FIG. 7 is a method for forming a semiconductor device, in accordance with some embodiments.

Referring now to FIG. 7, a method 700 for forming a semiconductor device is provided, in accordance with some embodiments. For example, at least some of the operations described in the method 700 may result in the semiconductor devices or views depicted in FIGS. 1-6. The disclosed method 700 is disclosed as a non-limiting example, and additional operations may be provided before, during, and after the method 700 of FIG. 7. Further, some operations may only be described briefly herein, however, one skilled in the art will understand that the disclosed operations may be performed in conjunction with other disclosed methods disclosed herein, or generally known in the art. Further, the order of the disclosed operations is not intended to be limiting; certain operations may be performed in a different sequence, and still further operations may be sequenced with appropriate modifications thereto. Further, at least a portion of some operations can be perfumed coextensively. For example, a layer comprising an inductor 122 of the filter 118 and a second terminal 106 of the spiral inductor 102 can be formed so as to simultaneously form both elements. Further, the various sequence of operations can result in various numbers or relative positions of the layers depicted in FIG. 3 (e.g., the circuit portion thereof can be disposed over or under the PGS 112, over or under the RDL 302, etc.).

The method 700 includes operation 702, of forming interconnect layers between the various portions of an active surface 314 of a semiconductor device 100. For example, interconnections can be formed in one or more metallization layers over the active surface 314 (e.g., a planar or other active surface 314), or extending therefrom. The interconnections can include connections between the portions of the active surface (e.g., n-wells, p-wells, gate structures, oxides, or so forth). A portion of the interconnections can be disposed vertically over the active surface 314. A portion of the interconnections can extend laterally from the active surface 314, such as to connect to further elements of the semiconductor device 100 (e.g., a redistribution layer, a terminal such as a micro-bump, another active surface, etc.). For example, a first interconnect layer can include via structure (e.g., well contact via).

A second interconnect layer can be formed over the first interconnect layer, the second interconnect layer including lateral conductive elements to connect one or more of the via structures of the first interconnect layer, or to a landing location for a via structure of a third interconnect layer. Further interconnect layers can be formed over the surface of the semiconductor device 100, the interconnect layers including alternating via structures and lateral conductive elements. Nomenclature referring to interconnect layers or metallization layers is not intended to be limiting, and is merely provided to distinguish between other layers of the method 700 of FIG. 7, which correspond to layers depicted in FIG. 3. Such layers may be referred to as either of interconnect or metallization layers according to the present disclosure. Such interconnect layers can be formed by alternatively forming a metal layer, patterning over the metal layer, and selectively removing a portion of the metal layer (e.g., according to a lithographic process such as a positive or negative photo-resist process). A dielectric can be formed between the interconnects to electrically isolate portions thereof. The interconnects or the elements of the active surface may be referred to, individually or combinatorically, as circuits, circuit portions, or so forth.

The method 700 includes operation 704, of forming a first metallization layer 308 over the interconnect layers. The first metallization layer 308 can include a keep out area 310 or a restricted placement area 312. For example, a lateral portion of the first metallization layer 308 can include a dielectric, or conductive elements not connected to a net (e.g., metallization dummy fill). According to some embodiments, the first metallization layer 308 can include a portion of an RL filter 118. The filter 118 can electrically connect to the PGS 112.

The method 700 includes operation 706, of forming a second metallization layer 306 over the interconnect layers of operation 702. The second metallization layer 306 can include at least a portion of a PGS 112. The second metallization layer 306 can be formed according to a same or related process as the interconnects of operation 702. That is, a lithographic mask can define a pattern in a photoresist to define the various conductive elements 114 and conductive interconnects 116 of the PGS 112. In some embodiments, the PGS 112 may be planar, disposed on a single metallization layer of the semiconductor device 100. In some embodiments, the PGS 112 may span multiple layers of the semiconductor device 100, wherein the PGS 112 may include via structures 110 to interconnect the various layers. In some embodiments, the PGS 112 can include one or more signal paths to a ground or another reference voltage, which can include, but is not limited to an RL filter 118. In some embodiments, the PGS 112 can include a capacitance between the various portions thereof. A portion of the RL filter 118 can be disposed on a second metallization layer 306, first metallization layer 308, or another layer of the semiconductor device 100.

In some embodiments, the filter 118 electrically connects to the PGS 112 by via structures 110 vertically extending therebetween (e.g., to a resistor 120 or inductor 122 portion on another layer such as the first metallization layer 308 or a third metallization layer 304). In some embodiments, the filter 118 can electrically connect to the PGS 112 via a lateral connection, such as a lateral connection to a resistor 120 or inductor 122 laterally spaced from the PGS 112. Thus, the filter 118 components can be or include portions which are vertically spaced from the PGS 112 or laterally spaced from the PGS 112. The filter 118 can include a resistor 120 formed from a metallization layer (e.g., a serpentine resistor). The filter 118 can include a resistor 120 formed along the active surface 314 of the semiconductor device 100, or from other non-metal portions (e.g., from an oxide or epitaxial silicon formed vertically spaced from the active surface 314). At least a portion of the resistance can be a series resistance of an inductor 122 of the filter 118, or interlayer connections (e.g., via chains.) The inductor 122 can be formed laterally spaced from either of the PGS 112 or a spiral inductor 102 of operation 708. For example, the inductor 122 can be formed on a same layer as the spiral inductor 102 of operation 708, or on a layer between the spiral inductor 102 and the PGS 112. For example, the inductor 122 can be formed immediately below the windings of the spiral inductor 102, in a center region corresponding, vertically, to the spiral inductor 102, or laterally spaced from the spiral inductor 102.

The method 700 includes operation 708, of forming a spiral inductor 102 over the second metallization layer 306. The spiral inductor 102 can be formed on one or more layers of the semiconductor device. For example, the coil 108 of the spiral inductor 102 can be formed in an RDL layer 302. The spiral inductor 102 can include a terminal extending to another layer, such as to connect to another device disposed on the other layer or to pass under the coil 108 to extend to another region of the semiconductor device 100 laterally spaced from the coil 108. For example, the coil 108 can be a coil 108 for a PDN of the semiconductor device 100, wherein the terminals 102, 104 connect to further PDN elements (e.g., further PDN elements of the RDL 302).

One aspect of this description relates to a semiconductor device. The semiconductor device includes a spiral inductor. The semiconductor device include a patterned ground shield (PGS) electrically coupled with the spiral inductor. The semiconductor device includes a filter configured to exchange energy with the PGS. The semiconductor device includes a circuit vertically spaced from the spiral inductor, the PGS disposed between the circuit from the spiral inductor.

One aspect of this description relates to a system. The system includes a first inductor, configured to operate at a frequency. The system includes a second inductor. The system includes a capacitor. The capacitor includes a first conductive element of a patterned ground shield (PGS) electrically coupled with the first inductor. The capacitor include a second conductive element of the PGS. The capacitor include a dielectric disposed between the first conductive element and the second conductive element. The capacitor and the second inductor form an LC cavity. The LC cavity is configured to resonate at the frequency.

One aspect of this description relates to a filter. The filter includes an inductor. The filter includes a series resistor associated with (e.g., coupled to, coextensive with, etc.) the inductor. A first terminal of the filter connects to a patterned ground shield (PGS). The PGS is electrically coupled with a spiral inductor. A second terminal of the filter connects to a reference voltage. A center frequency of the filter is greater than one GHz.

One aspect of this description relates to a method. The method includes forming a metallization layer over an active surface of a semiconductor substrate, the metallization layer including a first terminal of a patterned ground shield (PGS), the first terminal connected to a shunt resistor of a filter having a center frequency exceeding one GHz. The method includes forming an inductor over the second metallization layer, the inductor electrically coupled with the PGS.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:

a spiral inductor configured to operate at an operating frequency;

a patterned ground shield (PGS) electrically coupled with the spiral inductor;

a filter electrically coupled with the PGS, wherein the filter comprises a second inductor in series with a resistor, and a center frequency of the filter corresponds to an operating frequency, and wherein the spiral inductor is a multi-tap spiral inductor, and wherein the spiral inductor comprises taps for the second inductor; and a circuit vertically spaced from the spiral inductor, the PGS disposed between the circuit and the spiral inductor.

2. The semiconductor device of claim 1, wherein the spiral inductor includes a copper redistribution layer.

3. The semiconductor device of claim 1, wherein at least a portion of the circuit is disposed in a layer vertically adjacent to the PGS.

4. The semiconductor device of claim 1, wherein the spiral inductor has a first terminal and a second terminal, the first terminal extending over the PGS along a same layer as a coil of the spiral inductor, and the second terminal extending over the PGS along a layer disposed between the spiral inductor and the PGS.

5. The semiconductor device of claim 1, wherein the second inductor is laterally spaced from the PGS.

6. The semiconductor device of claim 1, wherein at least a portion of the circuit is disposed under a center region of the spiral inductor.

7. The semiconductor device of claim 1, wherein at least a portion of the circuit is disposed under a winding of the spiral inductor.

8. The semiconductor device of claim 1, wherein the filter is a notch filter having a center frequency corresponding to an operating frequency of the circuit.

9. The semiconductor device of claim 1, wherein the filter is a notch filter having a center frequency corresponding to a component of a signal passing through the spiral inductor.

10. The semiconductor device of claim 1, wherein the filter is a notch filter having a center frequency exceeding about one GHz.

11. A system comprising:

a first inductor, configured to operate at a frequency;

a second inductor; and a capacitor comprising:

a first conductive element of a patterned ground shield (PGS) electrically coupled with the first inductor;

a second conductive element of the PGS; and a dielectric disposed between the first conductive element and the second conductive element, wherein the capacitor and the second inductor operatively form an LC cavity, and wherein the LC cavity is configured to resonate at the frequency.

12. The system of claim 11, further comprising: a circuit vertically spaced from the first inductor, the PGS disposed between the circuit and the first inductor.

13. The system of claim 11, wherein:

a coil of the first inductor is disposed on a first level of a semiconductor device;

a coil of the second inductor is disposed on a second level of the semiconductor device; and at least a portion of the PGS is disposed on a third level of the semiconductor device.

14. The system of claim 13, wherein the first level of the semiconductor device is a redistribution layer (RDL), and the second level of the semiconductor device is not a RDL.

15. The system of claim 11, wherein the first inductor is a portion of a power distribution network (PDN) of a semiconductor device.

16. The system of claim 11, wherein the frequency extends over a frequency range.

17. A method for fabricating a semiconductor device, comprising:

forming a metallization layer over an active surface of a semiconductor substrate, the metallization layer comprising a first terminal of a patterned ground shield (PGS), the first terminal connected to a series resistor of a filter having a center frequency exceeding one GHz, wherein the filter comprises:

an aggregate capacitance of the PGS;

an inductor; and the series resistor, the filter having an LC cavity at the center frequency; and forming an inductor over the metallization layer, the inductor electrically coupled with the PGS.

18. The method of claim 17, wherein forming the inductor over the metallization layer comprises forming the inductor in a copper redistribution layer.

19. The method of claim 17, wherein the inductor is a spiral inductor having a first terminal and a second terminal, the first terminal extending over the PGS along a same layer as a coil of the spiral inductor, and the second terminal extending over the PGS along a layer disposed between the spiral inductor and the PGS.

20. The method of claim 17, further comprising forming at least a portion of a circuit under a center region of the inductor.

* * * * *